United States Patent
Rogers et al.

(10) Patent No.: US 9,267,822 B1
(45) Date of Patent: Feb. 23, 2016

(54) SYSTEMS AND METHODS FOR EVALUATING COUPLED COMPONENTS

(71) Applicants: Al-Aakhir Ahad Rogers, Tampa, FL (US); Shekhar Bhansali, Tampa, FL (US)

(72) Inventors: Al-Aakhir Ahad Rogers, Tampa, FL (US); Shekhar Bhansali, Tampa, FL (US)

(73) Assignee: University of South Florida, Tampa, FL (US)

( * ) Notice: Subject to any disclaimer, the term of this patent is extended or adjusted under 35 U.S.C. 154(b) by 228 days.

(21) Appl. No.: 13/784,191

(22) Filed: Mar. 4, 2013

Related U.S. Application Data

(60) Provisional application No. 61/605,885, filed on Mar. 2, 2012.

(51) Int. Cl.
| | |
|---|---|
| *G01D 5/38* | (2006.01) |
| *G02B 27/42* | (2006.01) |
| *G02B 5/18* | (2006.01) |
| *H05K 1/02* | (2006.01) |

(52) U.S. Cl.
CPC .............. *G01D 5/38* (2013.01); *G02B 27/4272* (2013.01); *G02B 5/1809* (2013.01); *H05K 1/0266* (2013.01)

(58) Field of Classification Search
CPC .............. G02B 6/3586; G02B 6/4219; G02B 27/4272; G02B 5/1809; G03F 9/7065; H01L 23/544; H05K 1/0266
See application file for complete search history.

(56) References Cited

U.S. PATENT DOCUMENTS

| | | | |
|---|---|---|---|
| 5,415,835 | A | 5/1995 | Brueck |
| 7,109,517 | B2 | 9/2006 | Zaidi |
| 7,167,615 | B1 | 1/2007 | Wawro |

FOREIGN PATENT DOCUMENTS

WO 2011081692 A2 7/2011

OTHER PUBLICATIONS

Rogers, Al-Aakhir A., "Evanescent Wave Coupling Using Different Subwavelength Gratings for a MEMS Accelerometer" (2011). Graduate Theses and Dissertations. http://scholarcommons.usf.edu/etd/3319.*
Rogers, et al., "Verification of Evanescent Coupling from Subwavelength Grating Pairs", Applied Physics B, Laser and Optics, Sep. 11, 2011.
Rogers, et al., "Far-Field Evanescent Wave Propagation Using Coupled Subwavelength Gratings for a MEMS Sensor", 2009 Optical Society of America, J. Opt. Soc. Am A/vol. 26, No. 12, Dec. 2009.
Rogers, et al., "Evanescent Wave Coupling Using Different Subwavelength Gratings for a MEMS Accelerometer", A dissertation submitted in the partial fulfillment of requirements for degree of Doctor of Philosophy, Mar. 28, 2011.
Cao, et al., "Influence of Aperture Shape on the Transmission Properties of a Periodic Array of of Subwavelength Apertures", Opt. Express 12, 1004-1010, 2004.

(Continued)

*Primary Examiner* — Kara E Geisel
*Assistant Examiner* — Rebecca C Bryant
(74) *Attorney, Agent, or Firm* — Thomas | Horstemeyer, LLP

(57) ABSTRACT

In some embodiments, a system for evaluating coupled components includes a first diffraction grating provided on a first component, a second diffraction grating provided on a second component, a light source that emits light having a wavelength that is larger than the grating periods of the first and second diffraction gratings, and a photodetector that senses the intensity of the light after it passes through the diffraction gratings.

24 Claims, 6 Drawing Sheets

(56) References Cited

OTHER PUBLICATIONS

J. Voros, et al., "Optical Grating Coupler Biosensors", Biomaterials 23, 3699-3710 (2002).

Quidant, et al. "Near-field observation of evanescent light wave coupling in subwavelength optical wavegiudes", Europhys. Lett. 57, 191-197 (2002).

Cheben, et al., "Subwavelength Waveguide Grating for Mode Conversion and Light Coupling in Integrated Optics", Opt. Express 14, 4695-4702. (2006).

Cho, et al., "Apertureless terahertz Near-Field Microscopy", Semicond. Sco. Technol. 20 S286-S292 (2005).

K. G. Gasvik, "Optical Metrology", 3rd ed. (Wiley, 2002).

K. Yee, "Numberical Solutions of Initial Boundary Value Problems Involving Maxwell's Equations in Isotropic Media", IEEE Trans Antennas Propag. 14, 302-307 (1966).

Barbara, et al., "Optical transmission through subwavelength metallic gratings," Phys. Rev. B 66, 161403 (2002).

Horvath, et al. "Analytical and Numerical Study on Grating Depth Effects in Grating Coupling Waveguide Sensors," Appl. Phys. B: Lasers Opt. 81, 65-73 (2005).

Ishimori, et al. "Subwavelength antireflection gratins for light emitting diodes and phtodiodes fabricated by fast atom bean etchings," Jpn. H. Appl Phys. 41, 4346-4349, (2002).

Lee, et al., "Color filter based on a subwavelength patterned metal grating," Opt. Express 15, 15457-15463 (2007).

Keeler, et al., "Laterally Deformable Optical NEMS grating Transducers for Inertial sensing Applications", Proc. SPIE 5592, 306-312 (2005).

Taniguchi, et al., "Development of an apertureless near-field optical microscope for nanoscale optical imaging at low temperatures", Jpn. J. Appl. Phys. 44, 575-577 (2005).

\* cited by examiner

SYSTEMS AND METHODS FOR EVALUATING COUPLED COMPONENTS

CROSS-REFERENCE TO RELATED APPLICATION

This application claims priority to U.S. Provisional Application Ser. No. 61/605,885, filed Mar. 2, 2012, which is hereby incorporated by reference herein in its entirety.

BACKGROUND

It is common to couple electronic components together. For example, semiconductor chips are commonly bonded to silicon substrates. In some circumstances, it is desirable to evaluate the coupled components. For example, it may be desirable to evaluate the bond between the components. As another example, it may be desirable to determine whether or not the components have at some point been decoupled, for instance when tampering has occurred.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

Figure 1:
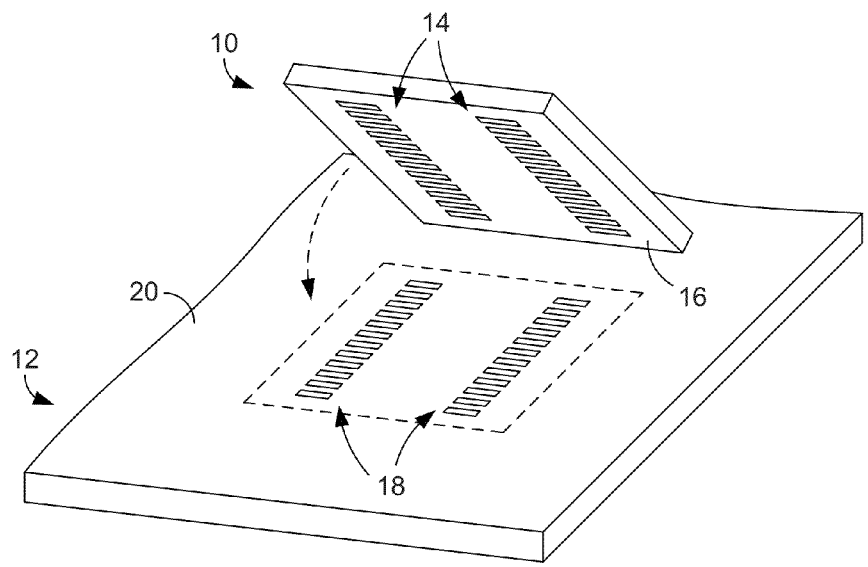
FIG. 1 is a schematic view illustrating a first component, in the form of a chip, that is about to be coupled to a second component, in the form of a substrate.

In certain situations it is desirable to evaluate coupled components, such as a semiconductor chip that is bonded to a silicon substrate. As is disclosed herein, such components can be evaluated by providing sub-wavelength diffraction gratings on each component that align with each other. When light is passed through the gratings, far-field diffraction occurs that can be used to evaluate the coupled components. In some embodiments, the integrity of the bond between the components can be evaluated. In other embodiments, it can be determined whether or not tampering has occurred.

In the following disclosure, various specific embodiments are described. It is to be understood that those embodiments are example implementations of the disclosed inventions and that alternative embodiments are possible. All such embodiments are intended to fall within the scope of this disclosure.

In the optics field, gratings are optical elements that disperse and diffract light. There are many types of diffraction gratings, which are specified by their geometry, material, efficiency behavior, fabrication type, and their application. Additionally, gratings are classified as either amplitude or phase gratings. Amplitude gratings are made by patterning and/or etching a material on top of a substrate, thus affecting only the amplitude of the incident source. Phase gratings are etched into the substrate and influence the phase of the incident wave. Diffraction is observed by reflecting from a reflection grating or by passing through a transmission grating. Typically, reflection gratings are coated with a metal layer in which the incident source is reflected from the grating and transmission gratings enable the incident source to pass through the medium.

Selecting a grating is application specific, wherein the grating efficiency and grating wavelength are common characteristics for grating selection. The grating efficiency is related to the grating shape, incidence angle, and the material properties. The grating wavelength or grating period is a co-contributor to the desired diffraction, the other contributor being the incident wavelength. Diffraction from a grating is visibly seen when the grating period is greater than the wavelength of the illuminating source. This type of diffraction is known as Fraunhofer diffraction.

Evanescent waves are electromagnetic waves that exhibit exponential decay as a function of the distance from the boundary at which the wave was formed. Such waves are generated in the near-field region of sub-wavelength gratings, which have a grating period shorter than the wavelength of the incident illumination source. Sub-wavelength gratings do not exhibit any higher diffraction orders and their evanescent waves exponentially decay as a function of distance from the grating. However, when two sub-wavelength gratings having different diffraction periods are placed in close proximity (e.g., are coupled), evanescent wave coupling occurs and higher diffraction orders are generated. In such a case, far-field diffraction occurs.

The above-described phenomena can be exploited to evaluate coupled components, such as electronic chips that are bonded to substrates. FIG. 1 illustrates an example in which a semiconductor chip 10 is to be bonded to a substrate 12 to form an electronic device. As is shown in the figure, the chip 10 is provided with two integrated diffraction gratings 14 on the underside 16 of the chip. The gratings 14 can be formed on the chip 10 using any suitable fabrication technique. In some embodiments, the gratings 14 are etched into the chip 10 using standard photolithographic processes. The gratings 14 have a grating period that is smaller than light that, as described below, will be passed through the gratings during evaluation. In such a case, the gratings 14 can be described as sub-wavelength gratings. In some embodiments, the light is within the visible or near-infrared spectrum, in which case the light can have a wavelength in the range of approximately 400 nanometers (nm) to 2.5 microns (μm). In such embodiments, the gratings 14 can have a grating period in the range of approximately 400 nm to 2.5 μm. As an example, if the light source is a green laser that emits light at 532 nm, the grating period can be in the range of approximately 400 to 500 nm. If the light source is a near-infrared laser that emits light at 1550 nm, the grating period can be in the range of approximately 1 to 1.4 µm.

With further reference to FIG. 1, the substrate 12 also has two integrated diffraction gratings 18 that are formed on the surface 20 of the substrate. As with the gratings 14, the gratings 18 can be formed using any suitable fabrication technique. The gratings 18 are configured on the substrate 12 so as to align with the gratings 14 of the chip 10 when the chip is bonded to the substrate 12 (the future footprint of the chip being identified with dashed lines in FIG. 1). The gratings 18 are also sub-wavelength gratings, but have a grating period that is different from the grating period of the gratings 14. By way of example, the gratings 18 also have a grating period in the range of approximately 400 nm to 2.5 µm. As an example, if the light source is a green laser that emits light at 532 nm, the grating period can be in the range of approximately 400 to 500 nm. If the light source is a near-infrared laser that emits light at 1550 nm, the grating period can be in the range of approximately 1 to 1.4 µm. In some embodiments, the grating period of the two gratings 14, 18 are close to each other in magnitude. For example, if one of the grating periods is 1.1 µm the other grating period can be 1.2 µm.

It is noted that, although FIG. 1 shows two rows of gratings 14 and 18, a single row or greater than two rows could be used, if desired.

Figure 2:
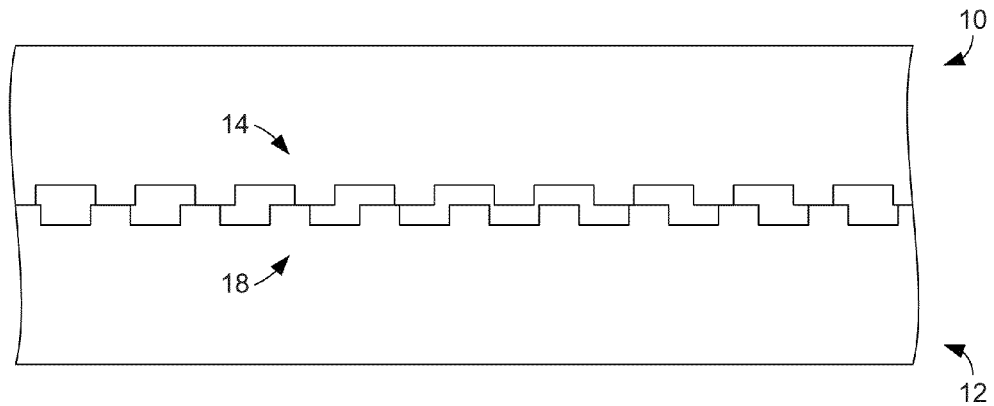
FIG. 2 is a side cross-sectional view of the components of FIG. 1 after they have been coupled together.

When the chip 10 is bonded to the substrate 12, the gratings 14, 18 are aligned with each other and are in close proximity. More particularly, the gratings 14, 18 face each other and are in or nearly in contact with each other. By way of example, the gratings 14, 18 are separated by a distance of approximately 0 µm to 0.6 µm. FIG. 2 shows the gratings 14, 18 in contact with each other after bonding of the chip 10 to the substrate 12. The difference in grating periods of the gratings 14 and 18 is apparent from the figure.

Figure 3:
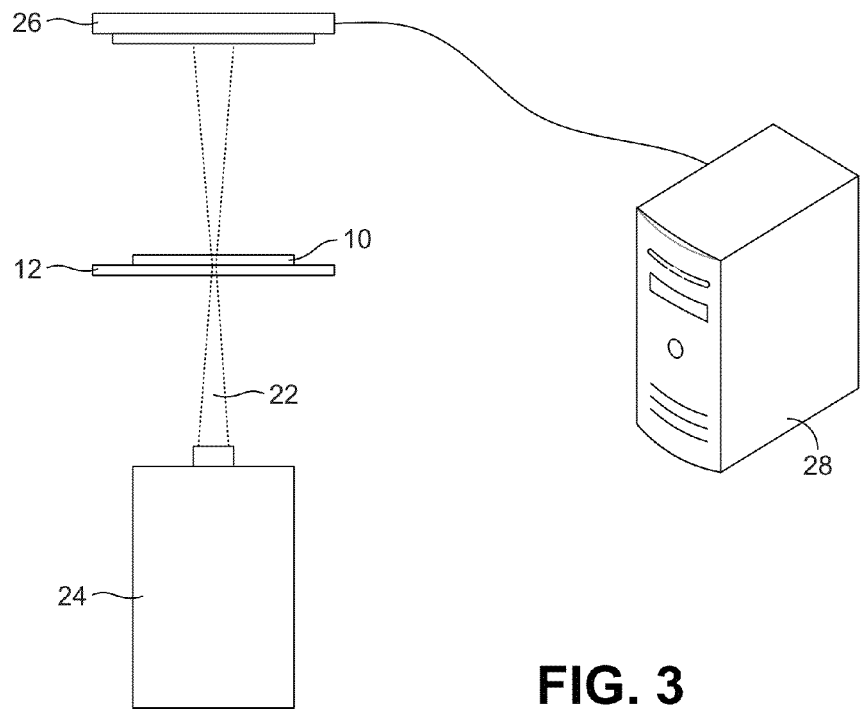
FIG. 3 is a block diagram illustrating radiating light through the coupled components of FIG. 2.

Once bonding has been performed, the bond can be evaluated for various purposes. FIG. 3 shows an example of such evaluation. As shown in FIG. 3, light 22 from a light source 24 is radiated through the gratings 14, 18 of the chip 10 and the substrate 12. Generally speaking, the light 22 is of a wavelength for which the materials of the chip 10 and substrate 12 are substantially transparent and of a wavelength that is larger than the wavelengths of the grating periods of the gratings 14, 18. If the chip 10 and substrate 12 are made of silicon-based materials, the light 22 can, for example, be infrared light and the light source 24 can be a laser. In embodiments in which the components are transparent (e.g., glass), the light 22 can be visible light.

When the light 22 passes through the sub-wavelength gratings 14, 18, the evanescent waves produced by the gratings couple and far-field diffraction occurs. The light intensity of the far-field diffraction can be sensed by a photodetector 26 and provided to a computer 28 for evaluation or analysis.

Figure 4:
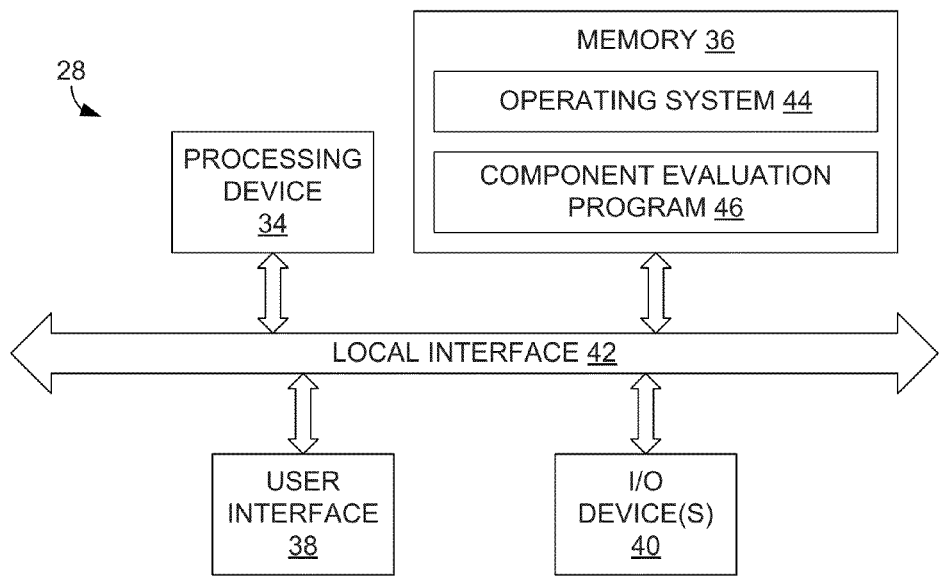
FIG. 4 is a block diagram of an example configuration of a computer shown in FIG. 3.

FIG. 4 illustrates an example configuration for the computer 28 shown in FIG. 3. As shown in FIG. 4, the computer 28 comprises a processing device 34, memory 36, a user interface 38, and at least one I/O device 40, each of which is connected to a local interface 42.

The processing device 34 can include a central processing unit (CPU) or a semiconductor based microprocessor (in the form of a microchip). The memory 36 includes any one of or a combination of volatile memory elements (e.g., RAM) and nonvolatile memory elements (e.g., hard disk, ROM, etc.). The user interface 38 comprises the components with which a user interacts with the computer 28, and the I/O devices 40 are adapted to facilitate communications with other devices.

The memory 36 (a non-transitory computer-readable medium) comprises programs (i.e., logic) including an operating system 44 and a component evaluation program 46. The component evaluation program 46 is configured to evaluate the coupling of two components, such as the chip 10 and the substrate 12. As mentioned above, the evaluation that is performed can relate to bond integrity. The spacing between two components can provide an indication of how well those components are bonded together, with greater spacing potentially indicating a weaker bond. This spacing affects the light intensity that is sensed by the photodetector. In particular, the greater the spacing between the components (and their gratings), the smaller the sensed light intensity and, presumably, the weaker the bond between the components. Such evaluation can be used in, for example, the manufacturing context. In such a case, sensed light intensity can be empirically correlated to component spacing prior to manufacturing. Once manufacturing begins, each manufactured device incorporating the components can be tested by obtaining a light intensity reading from a photodetector. That reading can be used by the component evaluation program 46 to determine whether or not the device complies with manufacturing targets.

Another form of evaluation that can be performed is tamper detection. Specifically, if the light intensity for the coupled components is initially determined, it can later be determined whether or not the components were separated from the each other at some point by again determining the light intensity under the same conditions and comparing it to the originally observed intensity. In such a process, an original light intensity signature can be compared with a later light intensity signature by the component evaluation program 46 to see if they match. If they do, the components have not likely been separated. If they do not match, however, the components likely have been separated from each other because the same signature is nearly impossible to reproduce once the components have been separated, even if great care is taken to align the components in the same manner in which they were originally aligned.

In the above discussion, it was assumed that the coupled components are electronic components (specifically a chip and a substrate) that are bonded together. It is noted, however, that the techniques described above can be applied to other components and other forms of coupling. Therefore, the chip/substrate example has been provided merely to facilitate discussion and in no way should be taken to limit the scope of this disclosure.

Figure 5:
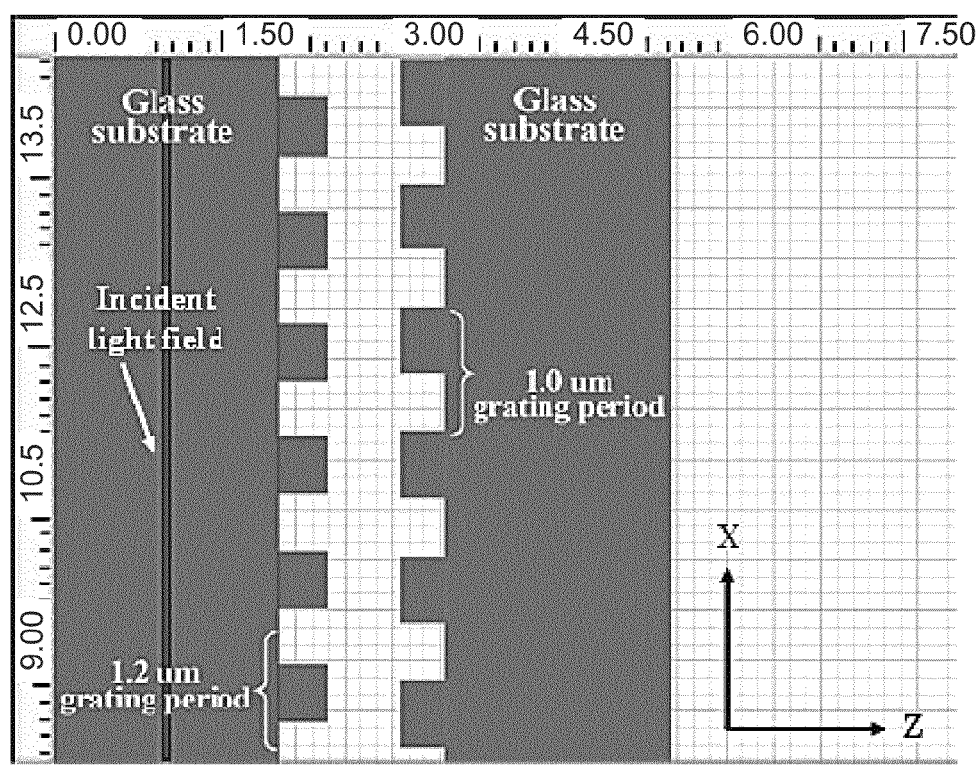
FIG. 5 is a finite-difference time-domain optical simulation of coupled sub-wavelength gratings of two glass substrates.

With reference next to FIG. 5, finite-difference time-domain (FDTD) optical simulations were performed to investigate evanescent wave coupling by varying the sub-wavelength grating thickness, grating width, and the gap separation between the gratings in both silicon and borosilicate glass substrates. The FDTD approach is based on solving the time-dependent Maxwell's curl equations where space and time steps relate to the accuracy, numerical dispersion, and the stability of the FDTD method.

Figure 6:
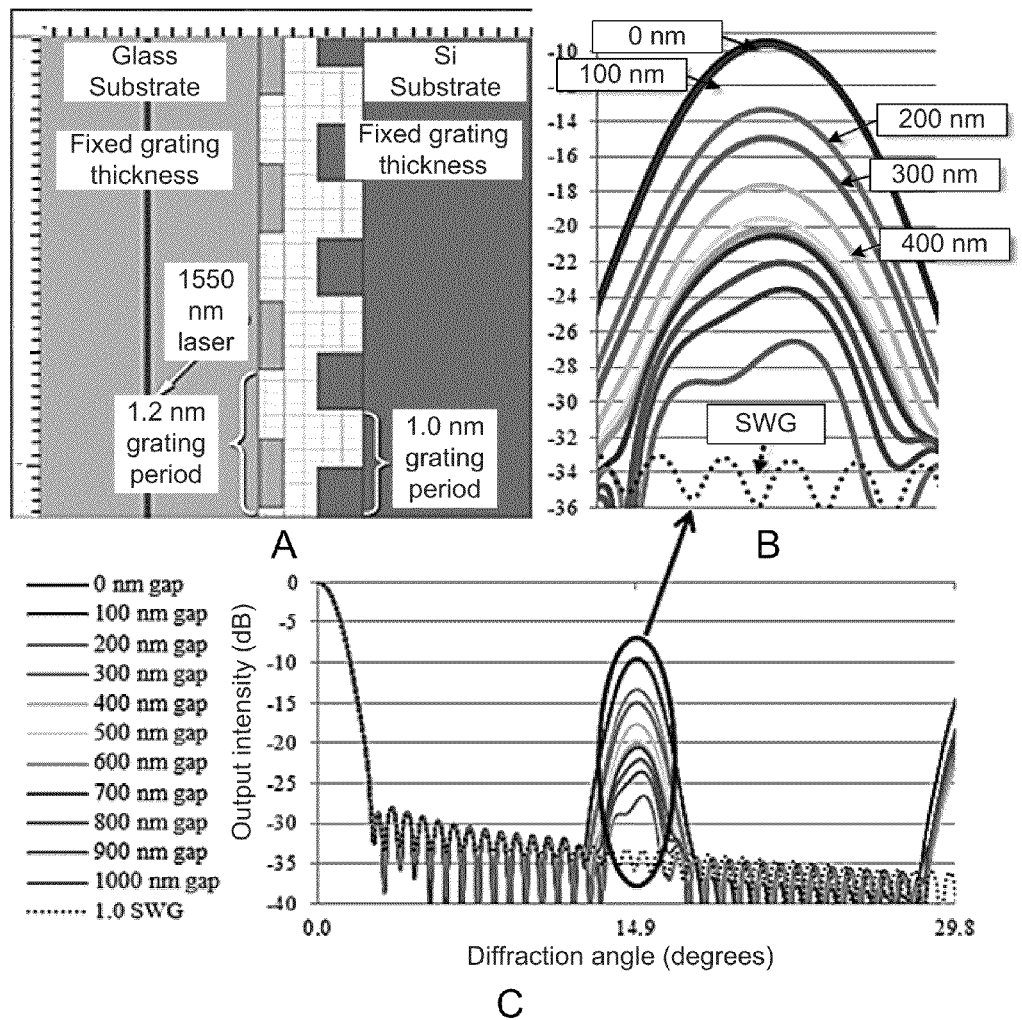
FIG. 6A is a finite-difference time-domain optical simulation of coupled sub-wavelength gratings of a glass substrate and a silicon substrate.
FIGS. 6B and 6C are graphs that plot output intensity versus diffraction angle for the coupled sub-wavelength gratings shown in FIG. 6A.

Various simulations were performed to obtain the maximum evanescent wave coupling efficiency in both glass and silicon substrates. A simulation layout of fixed grating thickness in the glass and silicon substrates is shown in FIG. 6A. As is apparent from the graphs of FIGS. 6B and 6C, the output intensity increases as the grating separation decreases.

Figure 7A:
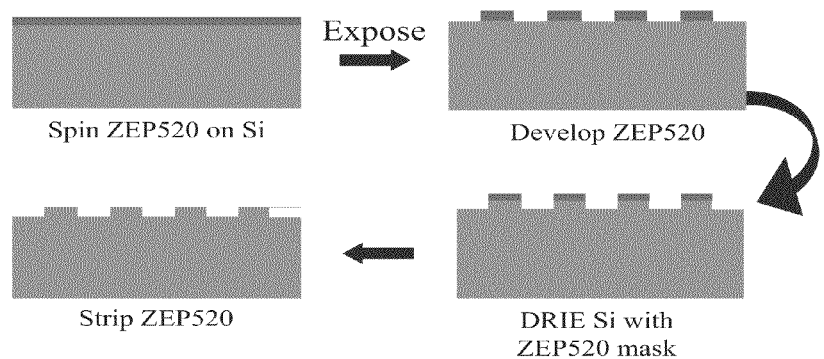
FIG. 7A is a schematic drawing depicting processing of the silicon substrate shown in FIG. 6A using electron beam lithography.
Figure 7B:
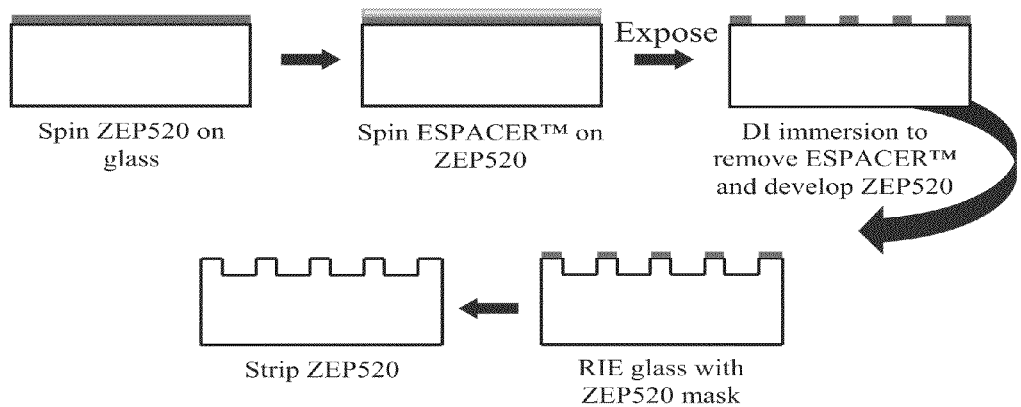
FIG. 7B is a schematic drawing depicting processing of the glass substrate shown in FIG. 6A using electron beam lithography.

In other prior work, sub-wavelength gratings were patterned using a JEOL JBX-9300FS electron beam lithography (EBL) system. A silicon substrate was spin coated with ZEP-520, a high resolution e-beam resist, and was then exposed and developed in an ameyl-acetate solution. The patterned ZEP-520 was then used as a hard mask to form deep reactive ion etch (DRIE) gratings into the silicon substrate as shown in FIG. 7A. After the ZEP-520 is spun on the glass substrate, a thin water soluble conductive polymer ESPACER™ (polyisothianaphthenesulfonate) was spun on the ZEP520 to dissipate the charge build-up during EBL, as shown in FIG. 7B.

The ZEP520 resist was used as a mask layer to etch the gratings 0.3 μm deep into the glass substrate using a Unaxis 790-10-RIE tool with trifluoromethane (CHF3) and oxygen ($O_2$). The Si was etched 0.14 μm deep in silicon using a Unaxis SLR-7701-10R-B Bosch DRIE system. The wafers were cleaned in acetone and methanol, and in $O_2$ plasma. The wafers were then anodically bonded using an EVG 501 wafer bonder with at a bond voltage of 400 V, a temperature of 400° C., and a pressure of 500 mTorr for 20 minutes. After that, the wafers were diced into test samples.

Figure 8A:
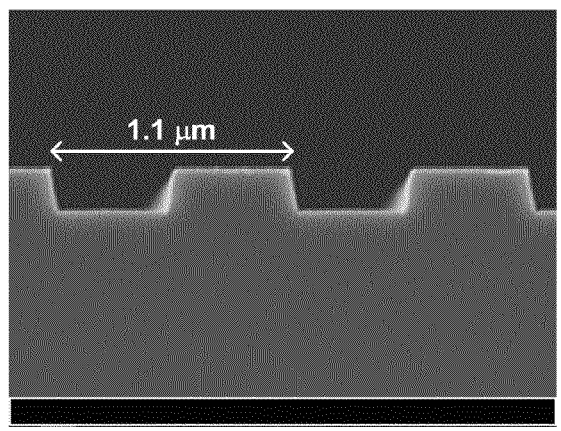
FIG. 8A is a scanning electron microscope image of the grating of a fabricated glass substrate.
Figure 8B:
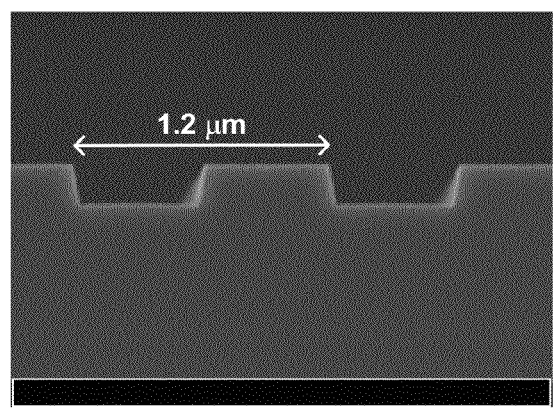
FIG. 8B is a scanning electron microscope image of the grating of a fabricated silicon substrate.
Figure 8C:
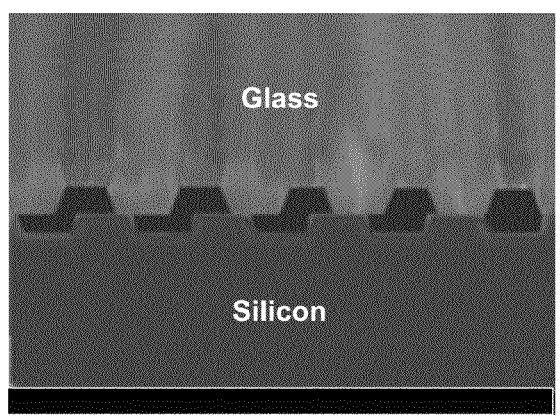
FIG. 8C is a scanning electron microscope image of the glass and silicon substrates of FIGS. 8A and 8B after coupling of the substrates.

The images in FIGS. 8A-C show the gratings etched in the silicon substrate, the glass substrate, and the anodically bonded pair, respectively. The gratings etched in the glass and the bonded pair were sputter coated with Au/Pd to dissipate the charge build-up during SEM analysis.

The SEM analysis revealed that the sidewalls of the sub-wavelength gratings were sloped and not rectangular. This trapezoidal grating profile was re-simulated using the FDTD optical software to resemble the actual grating profile of the fabricated sub-wavelength gratings, to estimate expected output intensity of light passing through the coupled gratings.

For the experimental setup, a 1.55 μm infrared laser beam was incident on one of three coupled pairs. Diffraction was observed in the far field and the measured output intensity was recorded and compared with the simulation output. The three anodically-bonded, coupled sub-wavelength grating pairs (1.0 μm×1.1 μm, 1.0 μm×1.2 μm, 1.0 μm×1.3 μm), which represent having a 0 μm grating separation, were individually placed in the optical setup where the infrared laser beam was incident on the 1 mm×1 mm coupled sub-wavelength grating area. The results of the analysis and experimentation are shown in Table 1.

TABLE 1

| Grating Pairs | Measured output power $0^{th}$ order (mW) | Measured output power $+1^{st}$ order (μW) | Measured output power $+1^{st}$ order (dB) | Simulated output power $+1^{st}$ order (dB) | Simulated output power $+1^{st}$ order (μW) |
|---|---|---|---|---|---|
| 1.0 μm & 1.1 μm | 0.39 | 9.3 | −16.3 | −13.2 | 18.2 |
| 1.0 μm & 1.2 μm | 0.39 | 18.1 | −13.3 | −13.2 | 18.8 |
| 1.0 μm & 1.3 μm | 0.38 | 6.6 | −17.6 | −16.2 | 9.4 |

The simulated and experimental results of Table 1 verify that evanescent wave coupling can be used to generate propagating waves. As can be appreciated from these results, using the longer 1.0 μm×1.3 μm sub-wavelength grating pair, as opposed to the shorter 1.1 μm or 1.2 μm sub-wavelength grating pairs, provides the advantage that the spatial separation of diffraction from the 1st order from the 0th order is larger. Additionally, fabrication of longer period gratings permits some process tolerance during fabrication.

The invention claimed is:

1. A system for evaluating coupled components, the system comprising:
    a first diffraction grating provided on a first component;
    a second diffraction grating provided on a second component that is bonded to the first component;
    a light source that emits light having a wavelength that is larger than grating periods of the first and second diffraction gratings;
    a photodetector that senses the intensity of the light after it passes through the diffraction gratings; and
    a component evaluation program executable on a computing device that is configured to receive intensity data from the photodetector and evaluate the bond between the first and second components based upon the intensity data.

2. The system of claim 1, wherein the light source is a laser.

3. The system of claim 2, wherein the laser emits visible light.

4. The system of claim 2, wherein the laser emits infrared light.

5. The system of claim 1, wherein the first diffraction grating has a first grating period and the second diffraction grating has a second grating period that is different from the first grating period.

6. The system of claim 1, wherein the first and second diffraction gratings each have a grating period within the range of approximately 400 nanometers to 2.5 microns.

7. The system of claim 1, wherein the first and second diffraction gratings each have a grating period within the range of approximately 400 to 500 nanometers.

8. The system of claim 1, wherein the first and second diffraction gratings each have a grating period within the range of approximately 1 to 1.4 microns.

9. The system of claim 1, wherein the first and second diffraction gratings are separated by a distance of approximately 0 to 0.6 microns.

10. The system of claim 1, wherein the first component is a semiconductor chip and the second component is a silicon substrate.

11. A method for evaluating coupled components, the method comprising:
    providing a first diffraction grating on a first component;
    providing a second diffraction grating on a second component;
    bonding the two components together with the first and second diffraction gratings aligned and positioned in close proximity with each other;
    radiating light through the diffraction gratings, the light having a wavelength that is larger than the grating periods of the first and second diffraction gratings;
    sensing the intensity of the light after it passes through the diffraction gratings and providing intensity data to a computing device; and
    receiving the intensity data with the computing device and evaluating the bond between the first and second components based upon the intensity data.

12. The method of claim 11, wherein providing the gratings comprises providing gratings having different grating periods.

13. The method of claim 11, wherein bonding comprises bonding the components such that the gratings are separated by a distance of approximately 0 to 0.6 microns.

14. The method of claim 11, wherein radiating light comprises radiating visible or near-infrared light through the diffraction gratings.

15. The method of claim 11, wherein the first and second diffraction gratings each have a grating period within the range of approximately 400 nanometers to 2.5 microns.

16. The method of claim 11, wherein the first component is a semiconductor chip and the second component is a silicon substrate.

17. The system of claim 1, wherein the component evaluation program is configured to evaluate the integrity of the bond.

18. The system of claim 17, wherein the component evaluation program evaluates the integrity of the bond based on a spacing between the gratings as determined from the intensity data.

19. The system of claim 1, wherein the component evaluation program is configured to determine whether or not the components have been separated from each other.

20. The system of claim 19, wherein the component evaluation program determines whether or not the components have been separated from each other by comparing an original light intensity signature with a later light intensity signature to see if they match.

21. The method of claim 11, wherein evaluating the bond between the first and second components comprises evaluating the integrity of the bond.

22. The method of claim 21, wherein evaluating the integrity of the bond comprises determining a spacing between the gratings from the intensity data.

23. The method of claim 11, wherein evaluating the bond between the first and second components comprises determining whether or not the components have been separated from each other.

24. The method of claim 23, wherein determining whether or not the components have been separated from each other comprises comparing an original light intensity signature with a later light intensity signature to see if they match.

* * * * *